United States Patent
Absar et al.

(10) Patent No.: US 7,424,502 B2
(45) Date of Patent: Sep. 9, 2008

(54) NON-UNIFORM FILTER BANK IMPLEMENTATION

(75) Inventors: Mohammed Javed Absar, Singapore (SG); Sapna George, Singapore (SG)

(73) Assignee: STMicroelectronics Asia Pacific PTE Ltd., Singapore (SG)

( * ) Notice: Subject to any disclaimer, the term of this patent is extended or adjusted under 35 U.S.C. 154(b) by 690 days.

(21) Appl. No.: 10/490,727

(22) PCT Filed: Sep. 28, 2001

(86) PCT No.: PCT/SG01/00198

§ 371 (c)(1),
(2), (4) Date: Apr. 7, 2005

(87) PCT Pub. No.: WO03/028213

PCT Pub. Date: Apr. 3, 2003

(65) Prior Publication Data

US 2005/0216541 A1    Sep. 29, 2005

(51) Int. Cl.
*G06F 17/10* (2006.01)
(52) U.S. Cl. .................................... 708/313
(58) Field of Classification Search ................ 708/313
See application file for complete search history.

(56) References Cited

U.S. PATENT DOCUMENTS

| | | | | |
|---|---|---|---|---|
| 5,621,404 A | * | 4/1997 | Heiss et al. | 341/61 |
| 5,751,615 A | * | 5/1998 | Brown | 708/313 |
| 5,872,480 A | * | 2/1999 | Huang | 329/304 |
| 6,279,019 B1 | * | 8/2001 | Oh et al. | 708/300 |
| 2002/0122562 A1 | * | 9/2002 | Brennan et al. | 381/316 |

OTHER PUBLICATIONS

Absar, M. et al., "On the Search for Compatible Numbers in the Design of Maximally Decimated Perfect Reconstruction Non-Uniform Filter Bank," in *Proceedings of the 2001 IEEE Workshop on Signal Processing Systems*, Antwerp, Belgium, Sep. 26-28, 2001, pp. 141-148.

(Continued)

*Primary Examiner*—David H Malzahn
(74) *Attorney, Agent, or Firm*—Lisa K. Jorgenson; David V. Carlson; Seed IP Law Group PLLC

(57) ABSTRACT

A method of searching for a best-match decimation vector of decimation factors for non-uniform filter bank, the best match vector allowing perfect or near-perfect reconstruction of an input signal of the non-uniform filter bank, the method including the steps of: a) selecting a partial decimation vector having a number, l, of decimation factors, where l does not exceed a maximum number, K, of decimation factors of said best-match decimation vector; b) testing said l decimation factors to determine whether said partial decimation vector satisfies a feasibility criterion; c) testing a least common multiplier value of said l decimation factors to determine whether said least common multiplier value is greater than a predetermined value; d) testing a maximum decimation value, $D_{max}$, of said partial decimation vector to determine whether $D_{max}$ is less than one; e) testing a minimum decimation value, $D_{min}$, of said partial decimation vector to determine whether $D_{min}$ is greater than one; and f) if said feasibility criterion is satisfied and $D_{max}$ is not less than one and $D_{min}$ is not greater than one, then incrementing by one the number l of decimation factors in the partial decimation vector and repeating steps b) to e) for a plurality of times.

16 Claims, 1 Drawing Sheet

OTHER PUBLICATIONS

"The 2001 IEEE Workshop on Signal Processing Systems (SIPS)," *IEEE CAS (TC-MSA) ET SP (TC-MSP) Societies*, Antwerp, Belgium Sep. 26-28, 2001, Advanced Program, retrieved from http://www.imec.be/sips/ on May 23, 2002.

Begault, D., "3-D Sound for Virtual Reality and Multimedia," *NASA Center for Aerospace Information*, Hanover, MD, retrieved from http://human-factors.arc.nasa.gov/ihh/spatial/papers/pdfs_db/Begault_2000_3d_Sound_Multimedia.pdf on May 24, 2002, pp. 1-246.

* cited by examiner

NON-UNIFORM FILTER BANK IMPLEMENTATION

BACKGROUND OF THE INVENTION

1. Field of the Invention

The present invention relates to a non-uniform filter bank implementation. In particular, the invention relates to a non-uniform filter bank implementation for audio compression having improved coding efficiency.

2. Description of the Related Art

Decomposition of a signal into frequency bands, for analysis or processing, has found useful application in a large number of areas such as audio, speech and video processing. Consider audio compression where the audio signal x(n) is decomposed into frequency components by a bank of K-filters (also sometimes termed as frequency transformation or sub-band coding) to yield K signal-components $X_k[n]$, k ranging over 0 ... K−1. The data rate at each filter output is equal to the input rate of x(n). This implies an K-fold increase in the overall data-rate. Decimation is therefore performed to bring down the data-rate. Decimation by a factor of $n_i$ implies that only one out of $n_i$ samples out of the filter is considered. If the input rate of the system is R and the decimation factor at the $i^{th}$ filter is $n_i$, then the output rate from the system is $$R \cdot \sum_{i=0}^{K-1} 1/n_i.$$

Ideally, this should be equal to one (less than one implies a loss of information). When $$\sum_{i=0}^{K-1} 1/n_i = 1,$$

the system is said to be maximally decimated. When the decimation factor is $n_i$, the bandwidth of the corresponding filter $H_i(z)$ must be approximately $\pi/n_i$, to prevent aliasing corruption of the signal. If the decimation factor is the same for all filters, the design is simpler, and it is called a uniform-filter bank. In wavelets, the decimation factors, though not the same, vary only as powers of 2. A truly non-uniform filter bank is one in which each $n_i$ can assume any arbitrary value.

Following the decomposition and decimation, the signal is analyzed to find means of reducing the data-rate of the system.

FIG. 1 shows encoder and decoder blocks for an MPEG-I Audio Codec. An input pulse-code modulated audio signal (PCM Audio) in the encoder passes through an analysis filter bank for decimating the signal. The PCM Audio input signal is also passed to a psycho-acoustic model, which computes the masking curve. The masking information is used by the bit-allocation module to determine the number of bits to be used by the quantizer for quantizing each frequency component. The larger the number of bits used for quantization, the greater the accuracy of the representation. The trade-off is that the compression rate decreases with an increase in the number of quantization bits. Based on masking effects, the bit-allocation module computes the number of bits to be allocated to each frequency component such that quantization noise is rendered (masked) inaudible. Ancillary data are added to the quantized input signal and the composite bit stream is formatted before transmission. The ancillary data are used to transmit information about the audio signal such as sampling rate, the number of audio channels, encoder settings and all such meta-data which are necessary for correct decoding and reproduction of the audio signal at the decoder. At the receiver side, the decoder performs an inverse quantization followed by upsampling (with the same decimation factors used by the encoder) and filtering to obtain a closely matching version of the input signal x[n].

In the absence of quantization, it is desirable that the system reproduces the original signal x(n) with almost no distortion. A filter bank which achieves such a low level of distortion is called a Perfect Reconstruction Filter Bank. Compared to the non-uniform case, the theory of perfect reconstruction of a uniform filter bank is well understood and documented, and this explains why most existing codecs (MPEG-I Layer III, MPEG-2 AAC, AC-3) use uniform filter banks. The theory concerning non-uniform perfect reconstruction (PR) filter banks is still in its infancy.

It is noted that analysis by the psychoacoustics model is best when the signal decomposition is performed through a non-uniform filter bank that matches closely the critical frequency bands of the ear. Absence of a good understanding of non-uniform filter banks has in the past forced designers of codecs to settle for the less desirable uniform filter bank. However, recent developments in digital signal processing have enabled further study of this problem.

Consider a non-uniform filter-bank with decimation factors $(n_0, n_1, \ldots n_{K-1})$. It is well known that an arbitrary set will not necessarily result in a feasible PR system. For maximal-decimation, the condition $$\sum_{i=0}^{K-1} 1/n_i = 1 \qquad \text{Condition I}$$

must be satisfied.

Let L be the least common multiplier (1 cm) of set $$\{n_i\}_{i=0}^{K-1}$$

and let $k_i = L/n_i$, $i \in \{0, 1, \ldots K-1\}$. Perfect reconstruction is possible only if $$\left(\sum_{i=0}^{l-1} k_i\right) \equiv 0 \bmod k_l, \text{ for each } l \in \{1, \ldots K-1\} \qquad \text{Condition II}$$

The symbol ≡ here stands for congruence (e.g., '11≡1 mod 5', since 11−1 equals 10 which is divisible by 5). We shall call condition I the maximal-decimation-condition and condition II the feasibility-condition. A set of numbers satisfying both conditions is called a compatible-set.

Usually, the decimation-vector $V_{spec} = (n_0, n_1, \ldots n_{K-1}) \in N^K$, is defined by the application. $V_{spec}$ may not satisfy either condition. The problem is to find a vector $V_{best\_match} \in N^K$ such that it satisfies both conditions and is the closest match, in terms of a pre-defined measure d( ), to $V_{spec}$. That is, for all $V \in N^K$ such that V satisfies the maximal-decimation and feasibility conditions, $d(V, V_{best\_match}) \geq d(V_{spec}, V_{best\_match})$.

An exhaustive brute-force search (i.e., by evaluating every possible combination of decimation factors) for $V_{best\_match}$ over a set $S \subset N^k$ can be extremely computationally expensive. An efficient algorithm is required to perform the search efficiently.

BRIEF SUMMARY OF THE INVENTION

The number of vectors satisfying the maximal-decimation and feasibility conditions is rather small. Suppose the first I components of decimation vector $V_{partial}$ are fixed to $f_0$, $f_1, \ldots f_{I-1}$, respectively. Rather than trying every different combination on the remaining components and checking each resulting complete vector for compatibility, it would be more efficient to perform some preliminary tests on the partial-vector itself to check if it could ever lead to a compatible set. If tests reveal that no matter what the value of the remaining components, the initial assignment can never lead to a feasible (or acceptable) solution, then it is prudent to abandon that subspace and search in another direction. This would decrease the computational requirements of the search algorithm drastically.

The present invention provides a method of searching for a best-match decimation vector of decimation factors for a non-uniform filter bank, the best-match decimation vector allowing perfect or near-perfect reconstruction of an input signal of the non-uniform filter bank, the method including the steps of:

a) selecting a partial decimation vector having a number, $l \geq 1$, of decimation factors, where l does not exceed a maximum number, K, of decimation factors of said best-match decimation vector;

b) processing said l decimation factors to determine whether said partial decimation vector satisfies a feasibility criterion;

c) processing a least common multiplier value of said l decimation factors to determine whether said least common multiplier value is greater than a predetermined value;

d) processing a maximum decimation value, $D_{max}$, of said partial decimation vector to determine whether $D_{max}$ is less than one;

e) processing a minimum decimation value, $D_{min}$, of said partial decimation vector to determine whether $D_{min}$ is greater than one; and f) incrementing by one the number of decimation factors in the partial decimation vector and repeating steps b) to e) when said feasibility criterion is satisfied and said least common multiplier value is less than said predetermined value and $D_{max}$ is not less than one and $D_{min}$ is not greater than one.

In the preferred embodiment, a branch-and-bound method is inserted into the structure of the search procedure. For the bounding condition, four tests are used:

F-Test: A partial-test on feasibility of the partial decimation vector.

L-Test: A check on the growth of the least-common-multiplier value.

$D_{min}$-Test & $D_{max}$-Test: To check on the possibility of convergence to unity of the summation of the reciprocals of the decimation factors (maximal decimation condition).

The above tests are described further below and an example of the improvement in searching efficiency is provided.

Preferred embodiments of the invention are described hereinafter, by way of example only, with reference to the drawings mentioned above.

DETAILED DESCRIPTION OF THE INVENTION

Figure 1:
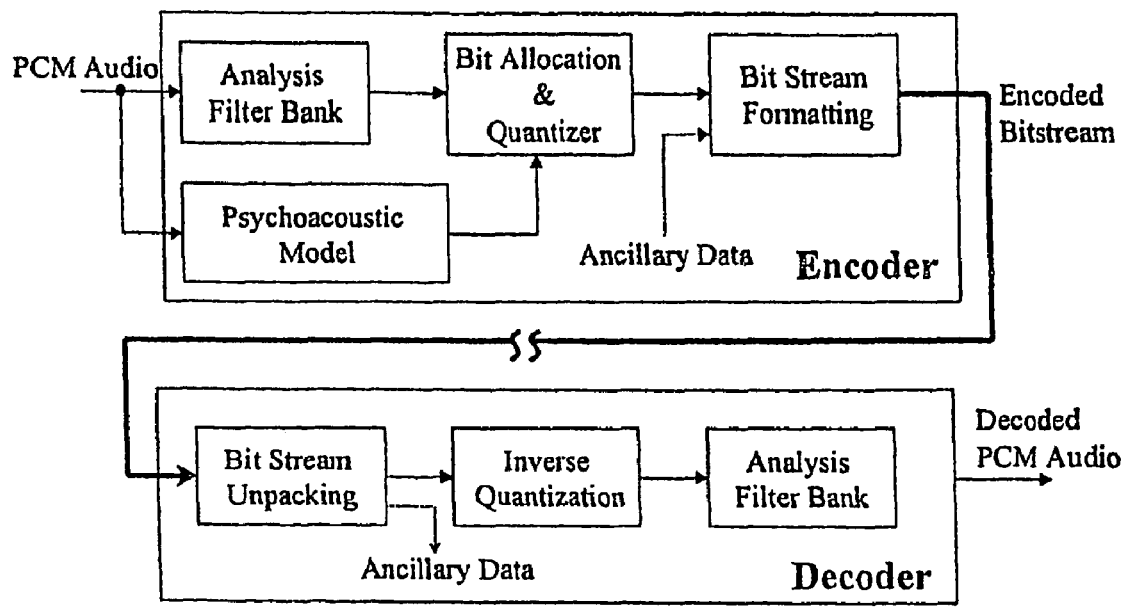
FIG. 1 is a block diagram of an encoder and decoder used for audio signal compression.
Figure 2:
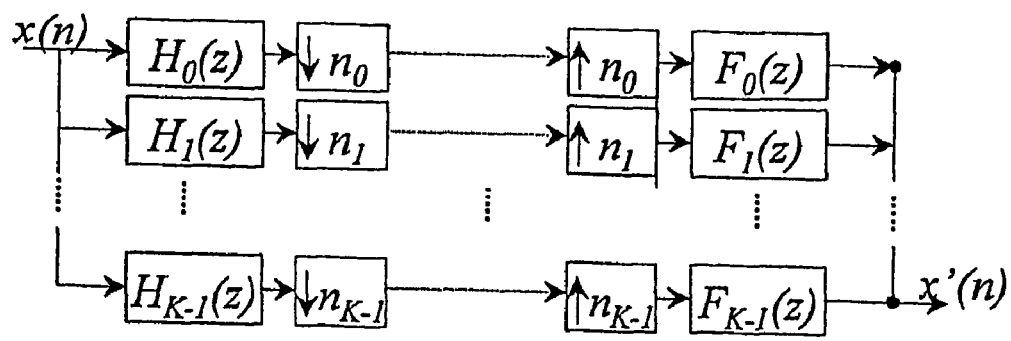
FIG. 2 is a block diagram representation of a non-uniform filter bank.

FIG. 2 shows a non-uniform filter bank structure where $x(n)$ is the input signal to the encoder of FIG. 1 and $x'(n)$ is the output signal from the decoder. $H_o(z), \ldots, H_{K-1}(z)$ and $F_o(z), \ldots, F_{K-1}(z)$ are the input and output transfer functions, respectively for the K input and output filters. $H_o(z), \ldots, H_{K-1}(z)$, in combination with the corresponding decimation factors $n_0, n_1, \ldots, n_{K-1}$, form the analysis filter bank on the encoder side, as shown in FIG. 1, and $F_o(z), \ldots, F_{K-1}(z)$, with the same decimation factors, form the analysis filter bank at the decoder for inverse filtering. A method of a preferred embodiment concerns determining an optimal decimation vector $V = (n_0, n_1, \ldots n_{K-1})$ to enable perfect reconstruction of the decimated input signal.

Suppose the vector $V_{spec} = (n_0, n_1, \ldots, n_{K-1}) \in N^K$ denotes the required set of decimation factors for a non-uniform filterbank. That is, the decimation factor following the first filter in the bank equals $n_0$, the decimation factor following the second filter is $n_1$, and so on.

If vector $V_{spec}$ satisfies the maximal-decimation and feasibility conditions, then the filter bank design can proceed according to known methods. If not, a closely matching vector $V_{best\_match} \in N^K$ that satisfies both conditions must be found.

The term 'closely matching' must be clearly defined. Suppose we define a measure that computes the difference between two decimation-vectors. Two vectors could then be considered as 'closely matching' if the difference computed is quite small. For example, we may define a measure $$d(A, B) = \sum_i \frac{|a_i - b_i|}{b_i},$$

where $A = (a_0, a_1, \ldots, a_{k-1})$ and $B = (b_0, b_1, \ldots, b_{k-1})$. This measure is the summation of the relative difference between each component of A and each corresponding component of B.

Therefore, $V_{best\_match}$ is considered to be the best-matching vector if it satisfies both the maximal-decimation and feasibility conditions and for all $V \in N^K$ such that V satisfies both conditions, $d(V, V_{spec}) \geq d(V_{best\_match}, V_{spec})$.

Searching the entire space $N^K$ is of course impossible. We therefore limit the search to a finite region around $V_{spec}$.

Let us define a vector $D = (d_0, d_1, \ldots, d_{k-1}) \in N^K$. Using D we define a region around $V_{spec}$ as $S = \{n_0 - d_0, n_0 - d_0 + 1, \ldots, n_0, \ldots n_0 + d_0\} \times \{n_1 - d_1, \ldots n_1 + d_1\} \times \ldots \times \{n_{K-1} - d_{K-1}, \ldots n_{K-1} + d_{K-1}\}$. The search is now limited to region S. Therefore, rephrasing the earlier statement, $d(V, V_{spec}) \geq d(V_{best\_match}, V_{spec})$, $\forall V \in S$: that maximal-decimation (V) and feasible(V).

A brute-force search over S may not be computationally feasible if it is a large set. For example, there are 25 critical bands in the ear-model. The corresponding decimation-vector is something like $(220, 220, 220, 220, \ldots 9, 6, 3)$. Taking D to be $(100, 100, \ldots, 5, 2, 0)$, the number of vector-evaluations needed by an exhaustive search would be in the order of $10^{35}$. Roughly, a single-vector evaluation on an Intel Pentium III processor takes $10^{-5}$ sec. Therefore an exhaustive search within even this restricted space would need $2.5 \times 10^{23}$ years.

Instead of enumerating each vector in S and checking if it satisfies both conditions, a intelligent methodical search of some sort is required. Here we propose a branch-and-bound based approach to the problem.

The branch-and-bound algorithm proceeds as follows: the search space is divided into a number of branches. Each branch is investigated in a sequential order. For each branch, it is estimated whether its exploration would result in a solution better than the existing one. If a particular branch is predicted not to produce any acceptable solution, or it is predicted that the best solution that it could offer would still be inferior to an existing solution, then further exploration of that branch is abandoned, in other words, that branch is bounded. The search-space is explored recursively and the algorithm is inherently recursive.

Now, the specific search problem is modeled as a branch and bound solution. Suppose we have a partial vector $V_{partial} = (f_0, f_1, \ldots f_{l-1}, x, \ldots, x) \in (N \cup \{x\})^K$. Here the first l components have been assigned some value. The remaining K−l components are denoted as x, meaning that they have not been assigned any value as yet. If l is equal to K−1, then $V_{partial}$ has some value assigned to each component. $V_{partial}$ is then checked to see if it satisfies the maximum-decimation and feasibility conditions. If it does, then its closeness to $V_{spec}$ is measured to see if it is a solution-vector closer than any previously found vector. If so, then $V_{partial}$ is assigned to the variable $V_{best\_match}$.

Suppose l is less than K−1. We then conduct a number of tests to check if $(f_0, f_1, \ldots f_{l-1}, x, \ldots, x)$ can lead to a compatible-set. If any of the tests fail, the partial vector (branch) is terminated prematurely, and the search moves onto the next branch.

F-Test: The first test is that of feasibility. Suppose that the unknowns in $V_{partial}$ were resolved to some $r_l, r_{l+1}, \ldots r_{k-1}$. Let us check if the feasibility condition would be satisfied.

Let $L = lcm(f_0, f_1, \ldots f_{l-1}, r_l, r_{l+1}, \ldots r_{K-l})$ and $L_{partial} = lcm(f_0, f_1, \ldots f_{l-1})$. Now elementary arithmetic tells us that $L = L_{partial} * U_r$, where $U_r$ is some constant. Now, $k_i = L/f_i$, therefore $k_i = (L_{partial}/f_i) * U_r$. Since $L_{partial}$ is a multiplier of $f_i$ it follows that $f_i$ divides $L_{partial}$. Consider the compatibility test, $$\left(\sum_{i=0}^{m-1} k_i\right) \equiv 0 \mod k_m.$$

That is, $$\left(\sum_{i=0}^{m-1} \frac{L_{partial} \cdot U_r}{f_i}\right) \equiv 0 \mod \frac{L_{partial} \cdot U_r}{f_m}.$$

This is equivalent to $$\left(\sum_{i=0}^{m-1} \frac{L_{partial}}{f_i}\right) \equiv 0 \mod \frac{L_{partial}}{f_m}, m \in \{1, 2 \ldots, l\}$$

If this condition is satisfied for all m, $V_{partial}$ is considered to pass the F-test. From this it can be seen that, even though $V_{partial}$ is partially fixed, it is possible to check feasibility for the already fixed components of a partial decimation vector.

L-Test: Next we impose a least common multiplier test (L-test) on $L_{partial}$. It is noted above that $L = L_{partial} * U_r$, i.e., $L > L_{partial}$. A very large lcm (e.g., if $f_0, f_1, \ldots f_{l-1}$, are all mutually-prime) is not very desirable. To prevent the search from veering into mutually-prime sets, a hard limit is placed on the lcm, $L_{max}$. If $L_{partial}$ is greater than $L_{max}$, then no matter what choice is made for $r_l, r_{l+1}, \ldots$ the composite lcm L would exceed $L_{max}$. Therefore if $L_{partial}$ is greater than $L_{max}$, the L-test fails and the search branch is terminated.

The next two tests are designed to test whether $$\sum_{i=0}^{K-1} 1/f_i$$

converges to one. The maximum value for $f_i$ is $1/(n_i - d_i)$ within the defined area around $V_{spec}$. Similarly, the minimum value is $1/(n_i + d_i)$. With $(f_0, f_1, \ldots f_{l-1})$ fixed, and $(r_l, r_{l+1}, \ldots r_{K-1})$ being some arbitrary numbers yet to be fixed, the $D_{max}$-Test (Maximum-Decimation Rate) and $D_{min}$-Test (Minimum-Decimation Rate) compute whether the current fixed assignments $f_0, f_1, \ldots f_{l-1}$ could ever lead to a convergence value of $$\sum_{i=0}^{K-1} 1/f_i$$

equal to unity.

$D_{max}$-Test (Maximum-Decimation Rate): Let $V_{partial} = (f_0, f_1, \ldots f_{l-1}, x, \ldots, x) \in (N \cup \{x\})^K$ be a partially assigned decimation vector. Define:

$$D_{max} = \sum_{i=0}^{l-1} 1/f_i + \sum_{i=l}^{K-1} \frac{1}{n_i + d_i}$$

If $D_{max} < 1$, then $$\sum_{i=0}^{K-1} 1/f_i$$

can never be equal to one, and consequently the test fails.

$D_{min}$-Test (Minimum-Decimation Rate): Define:

$$D_{min} = \sum_{i=0}^{l-1} 1/f_i + \sum_{i=l}^{K-1} \frac{1}{n_i - d_i}$$

If $D_{min} > 1$, then $V_{partial}$ would always lead to a vector whose sum of reciprocals would exceed unity, i.e., $$\sum_{i=0}^{K-1} 1/f_i$$

can never be equal to one.

An algorithm for effecting the four tests (F-test, L-test, $D_{max}$-test and $D_{min}$-test) is illustrated in pseudo-code in Appendix 1 hereto.

In table 1 below, the efficiency of the presently described Branch-and-Bound algorithm is compared against the exhaustive Brute-Force method.

TABLE 1

Efficiency Comparison

Number of Evaluations
(~proportional to processor execution time)

| K (number of Filters) | Brute-Force | Branch and Bound (Tests: $D_{min} + D_{max}$) | Branch and Bound (Tests: $D_{min} + D_{max} + L$) | Branch and Bound (Tests: $D_{min} + D_{max} + L + F$) |
|---|---|---|---|---|
| 3 | 2,744 | 211 | 211 | 45 |
| 4 | 384,16 | 2,866 | 2866 | 115 |
| 5 | 537,824 | 36,119 | 35,807 | 293 |
| 6 | 7,529,536 | 401,716 | 376,924 | 666 |
| 7 | 105,413,504 | 6,121,843 | 3,185,673 | 1311 |

In table 2 below, a compatible set of decimation factors which closely match the critical decimation factors (computed from the critical band frequencies) is presented. The critical band frequencies of the human ear are empirically determined and are spread across about 25 distinctly identifiable bands. The bandwidth of each band varies from slightly less than 100 $H_z$ at low frequencies to about one third of an octave at higher audible frequencies (e.g., 1.2 kHz for a center frequency of 10 kHz). The critical bands of the ear are generally continuous such that a tone of an audible frequency has a critical band centered on it.

TABLE 2

Best match decimation vector

| Critical-Band No. | $V_{spec}$ | $V_{best\_match}$ (LCM = 2520) |
|---|---|---|
| 1 | 220 | 210 |
| 2 | 220 | 210 |
| 3 | 220 | 210 |
| 4 | 220 | 210 |
| 5 | 200 | 210 |
| 6 | 183 | 168 |
| 7 | 158 | 168 |
| 8 | 148 | 140 |
| 9 | 138 | 140 |
| 10 | 116 | 120 |
| 11 | 105 | 120 |
| 12 | 92 | 90 |

TABLE 2-continued

Best match decimation vector

| Critical-Band No. | $V_{spec}$ | $V_{best\_match}$ (LCM = 2520) |
|---|---|---|
| 13 | 79 | 90 |
| 14 | 70 | 90 |
| 15 | 59 | 60 |
| 16 | 49 | 60 |
| 17 | 40 | 30 |
| 18 | 32 | 42 |
| 19 | 25 | 21 |
| 20 | 20 | 21 |
| 21 | 17 | 21 |
| 22 | 12 | 12 |
| 23 | 9 | 12 |
| 24 | 6 | 6 |
| 25 | 3 | 3 |

In the above chart, the $V_{best\_match}$ has decimation factors as shown. The critical band number is the number of a critical frequency base of the human ear.

From the foregoing it will be appreciated that, although specific embodiments of the invention have been described herein for purposes of illustration, various modifications may be made without deviating from the spirit and scope of the invention. Accordingly, the invention is not limited except as by the appended claims.

APPENDIX 1

Initialization: $V_{spec} = (n_0, n_1, \ldots, n_{K-1}) \in N^K$, $D = (d_0, d_1, \ldots, d_{K-1}) \in N^K$, $L_s$ = Limit on LCM, $error_{least}$ = any large number Algorithm branch_and_bound
    input: $V_{partial} = (f_0, f_1, \ldots, f_{l-1}, x, \ldots, x) \in (N \cup \{x\})^K$;
begin
    foreach $z \in \{-d_1, -d_1+1, \ldots 0, 1, 2, \ldots d_l\}$
        $F_{partial} = (f_0, f_1, \ldots f_{l-1}, n_l + z, x, \ldots, x)$;  // $f_l = n_l + z$
        if l.equals. K−1  // one complete solution . . . ?

// check feasibility and maximal dec.
$$\text{if } \sum_{i=0}^{K-1} 1/f_i = 1 \text{ .and.feasible}(F_{partials}, l+1)$$

// is this feasible solution better than
$$\text{if } \sum_{i=0}^{K-1} \frac{|n_i - f_i|}{n_i} < error_{least}$$

// previous one ?

APPENDIX 1-continued

Initialization: $V_{spec} = (n_0, n_1, \ldots, n_{K-1}) \in N^K$, $D = (d_0, d_1, \ldots, d_{K-1}) \in N^K$, $L_s$ = Limit on LCM,
error$_{least}$ = any large number $$< \text{error}_{least} = \sum_{i=0}^{K-1} \frac{|n_i - f_i|}{n_i}, F_{best\_match} = F_{partial};$$

```
                endif
            endif
        else
            if l .is greater than. 0
                if (.not.feasible(F_partial, l+1))          //F-Test
                    .or. (L_partial > L)                    //L-Test
```

$$.or. \left( \sum_{i=0}^{l} \frac{1}{f_i} + \sum_{i=l+1}^{K-1} \frac{1}{n_i + d_i} \right) > 1 \qquad //D_{min}\text{-Test}$$

$$.or. \left( \sum_{i=0}^{l} \frac{1}{f_i} + \sum_{i=l+1}^{K-1} \frac{1}{n_i - d_i} \right) < 1 \qquad //D_{max}\text{-Test}$$

```
                        continue;                           //since conditions fail, move on
next branch
                    end
                end
                branch_and_bound(F_partial, l+1);           //branch to next child
            end
end
Function feasible
    input: F_partial = f_0, f_1, ... f_{l-1}, x, ..., x ∈ (N∪{x})^K;
begin
    L_partial = lcm(F_partial, l)                           //lcm of the first l numbers
    foreach i ∈ {1,2,...l-1}                                //iterate
```

$$\text{if} \left( \sum_{k=0}^{i-1} \frac{L_{partial}}{f_k} \right) \equiv 0 \bmod \left( \frac{L_{partial}}{f_i} \right)$$

```
        return False
    end
    return True
End
```

The invention claimed is:

1. A method of searching for a best-match decimation vector of decimation factors for a non-uniform filter bank, the best-match decimation vector allowing reconstruction of an input signal of the non-uniform filter bank, the method comprising:
   a) selecting a partial decimation vector having a number l<1, of decimation factors, where l does not exceed a maximum number, K, of decimation factors of said best-match decimation vector;
   b) processing said l decimation factors to determine whether said partial decimation vector satisfies a feasibility criterion;
   c) processing a least common multiplier value of said l decimation factors to determine whether said least common multiplier value is greater than a predetermined value;
   d) processing a maximum decimation value, $D_{max}$, of said partial decimation vector to determine whether $D_{max}$ is less than one;
   e) processing a minimum decimation value, $D_{min}$, of said partial decimation vector to determine whether $D_{min}$ is greater than one; and
   f) incrementing by one the number of decimation factors in the partial decimation vector and repeating steps b) to e) when said feasibility criterion is satisfied and said least common multiplier value is less than said predetermined value and $D_{max}$ is not less than one and $D_{min}$ is not greater than one.

2. The method of claim 1, further including the step of:
   g) selecting a new partial decimation vector and repeating steps b) to f) when the feasibility criterion is not satisfied or the least common multiplier is greater than the predetermined value or $D_{max}$ is less than one or $D_{min}$ is greater than one.

3. The method of claim 2, further including the step of:
   h) repeating steps a) to g) until l=K and a best-match decimation vector is located.

4. The method of claim 1, wherein said feasibility criterion is satisfied if $$\left( \sum_{i=0}^{m-1} \frac{L_{partial}}{f_i} \right) \equiv 0 \bmod \frac{L_{partial}}{f_m}, \text{ for all } m \in \{1, 2, \ldots, l\}$$

where $L_{partial}$ is said least common multiple value and $f_0, f_1, \ldots, f_l$ are said decimation factors of said partial decimation vector.

5. The method of claim 1, wherein an ideal set of decimation factors is defined by a vector $V_{spec} = (n_0, n_1, \ldots, n_{K-1}) \in N^K$ and a vector D is defined as $D = (d_0, d_1, \ldots, d_{k-1}) \in N^K$, such that a region S around $V_{spec}$ is defined as $S=\{n_0-d_0, n_0-d_0+1, \ldots, n_0, \ldots n_0+d_0\} \times \{n_1-d_1, \ldots n_1+d_1\} \times \ldots \times \{n_{K-1}-d_{K-1}, \ldots n_{K-1}+d_{K-1}\}$ and wherein $D_{max}$ is determined by $$D_{\max} = \sum_{i=0}^{l-1} 1/f_i + \sum_{i=l}^{K-1} \frac{1}{n_i - d_i}.$$

6. The method of claim 5, wherein $D_{min}$ is determined by $$D_{\min} = \sum_{i=0}^{l-1} 1/f_i + \sum_{i=l}^{K-1} \frac{1}{n_i + d_i}.$$

7. A decimation vector generated by a method according to the steps comprising:
   a) selecting a partial decimation vector having a number, $l \geq 1$, of decimation factors, where l does not exceed a maximum number, K, of decimation factors of said best-match decimation vector;
   b) processing said l decimation factors to determine whether said partial decimation vector satisfies a feasibility criterion;
   c) processing a maximum decimation value, $D_{max}$, of said partial decimation vector to determine whether $D_{max}$ is less than one;
   d) processing a minimum decimation value, $D_{min}$, of said partial decimation vector to determine whether $D_{min}$, is greater than one; and
   e) incrementing by one the number of decimation factors in the partial decimation vector and repeating steps b) to e) when said feasibility criterion is satisfied and said least common multiplier value is less than said predetermined value and $D_{max}$ is not less than one and $D_{min}$ is not greater than one.

8. A decimation vector generated by a method according to claim 7, wherein $V_{best-match}$ has decimation factors as shown in the following table and where the critical band number is the number of a critical frequency band of the human ear

| Critical-Band No. | $V_{spec}$ | $V_{best\_match}$ (LCM = 2520) |
|---|---|---|
| 1 | 220 | 210 |
| 2 | 220 | 210 |
| 3 | 220 | 210 |
| 4 | 220 | 210 |
| 5 | 200 | 210 |
| 6 | 183 | 168 |
| 7 | 158 | 168 |
| 8 | 148 | 140 |
| 9 | 138 | 140 |
| 10 | 116 | 120 |
| 11 | 105 | 120 |
| 12 | 92 | 90 |
| 13 | 79 | 90 |
| 14 | 70 | 90 |
| 15 | 59 | 60 |
| 16 | 49 | 60 |
| 17 | 40 | 30 |
| 18 | 32 | 42 |
| 19 | 25 | 21 |
| 20 | 20 | 21 |
| 21 | 17 | 21 |
| 22 | 12 | 12 |
| 23 | 9 | 12 |
| 24 | 6 | 6 |
| 25 | 3 | 3. |

9. A codec adapted to execute the method comprising:
   a) selecting a partial decimation vector having a number, l, of decimation factors, where l does not exceed a maximum number, K, of decimation factors of said best-match decimation vector;
   b) testing said l decimation factors to determine whether said partial decimation vector satisfies a feasibility criterion;
   c) testing a maximum decimation value, $D_{max}$, of said partial decimation vector to determine whether $D_{max}$ is less than one;
   d) testing a minimum decimation value, $D_{min}$, of said partial decimation vector to determine whether $D_{min}$ is greater than one; and
   e) if said feasibility criterion is satisfied and $D_{max}$ is not less than one and $D_{min}$ is not greater than one, then incrementing by one the number l of decimation factors in the partial decimation vector and repeating steps b) to e) for a plurality of times.

10. The codec according to claim 9, wherein the codec is an audio codec.

11. The codec according to claim 9, wherein the decimation factors are selected based upon the band frequencies identifiable for the human ear.

12. The codec according to claim 9, wherein the bandwidth is different from each other for at least two of the band frequencies and the bandwidth is larger at the highest frequency than it is at the lowest frequency.

13. The codec according to claim 9, wherein the bandwidth at the lowest band frequency is about 100 Hz and the bandwidth at the highest band frequency is above 1 kHz, but less than 8 kHz.

14. The codec according to claim 13, wherein the bandwidth at the highest frequency is less than 3 kHz.

15. The codec according to claim 9, further including:
   testing a least common multiplier value of said l decimation factors to determine whether said least common multiplier value is greater than a predetermined value.

16. The codec according to claim 15 further including:
   incrementing by one the number l of decimation factors if the least common multiplier value is less than a predetermined value.

* * * * *